(12) United States Patent
Crespi et al.

(10) Patent No.: US 9,264,043 B2
(45) Date of Patent: *Feb. 16, 2016

(54) LOW POWER LEVEL SHIFTER WITH OUTPUT SWING CONTROL

(71) Applicant: CONEXANT SYSTEMS, INC., Irvine, CA (US)

(72) Inventors: Lorenzo Crespi, Costa Mesa, CA (US); Christian Larsen, Irvine, CA (US); Lakshmi P. Murukutla, Costa Mesa, CA (US); Ketan B. Patel, Lake Forest, CA (US)

(73) Assignee: CONEXANT SYSTEMS, INC., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/189,903

(22) Filed: Feb. 25, 2014

(65) Prior Publication Data

US 2014/0176223 A1      Jun. 26, 2014

Related U.S. Application Data

(63) Continuation of application No. 13/289,926, filed on Nov. 4, 2011, now Pat. No. 8,659,342.

(51) Int. Cl.
*H03L 5/00*      (2006.01)
*H03K 19/0185*   (2006.01)
*H03K 3/356*     (2006.01)

(52) U.S. Cl.
CPC .. *H03K 19/018528* (2013.01); *H03K 3/356182* (2013.01)

(58) Field of Classification Search
CPC .............................................. H03K 19/018528
USPC ................... 327/306, 333; 326/61–63, 80–81
See application file for complete search history.

(56) References Cited

U.S. PATENT DOCUMENTS

| | | |
|---|---|---|
| 7,034,573 B1 | 4/2006 | Chang |
| 7,288,967 B2 | 10/2007 | Byun et al. |
| 7,295,038 B2 | 11/2007 | Seo |
| 7,663,423 B1 | 2/2010 | Cheng |
| 7,679,420 B1 * | 3/2010 | Burkland et al. ............. 327/333 |
| 7,710,141 B2 * | 5/2010 | La Rosa et al. ............ 324/750.3 |
| 7,737,748 B2 * | 6/2010 | Kim et al. ..................... 327/175 |
| 7,839,198 B2 | 11/2010 | Nakamura et al. |
| 7,999,573 B2 | 8/2011 | Narwal et al. |
| 8,952,741 B1 * | 2/2015 | Chen et al. .................... 327/333 |

* cited by examiner

*Primary Examiner* — Dinh Le
(74) *Attorney, Agent, or Firm* — Haynes and Boone, LLP

(57) ABSTRACT

A level shifter comprising a first driver transistor for receiving an input signal. A gate-controlled transistor coupled to the first driver transistor. A second driver transistor coupled to the gate controlled transistor. An output coupled to the second driver transistor, wherein the gate-controlled transistor is for receiving a predetermined gate voltage when the output voltage exceeds a predetermined value.

20 Claims, 3 Drawing Sheets

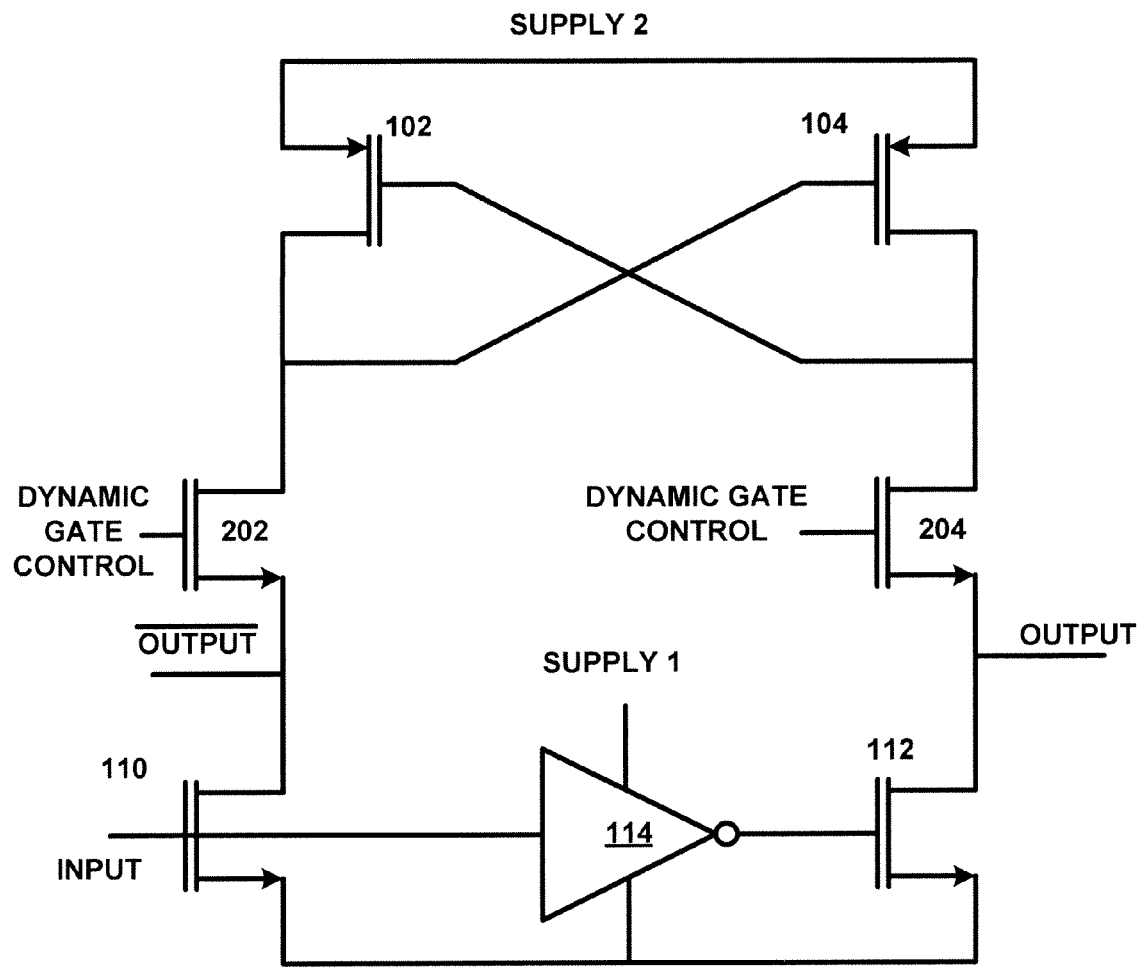

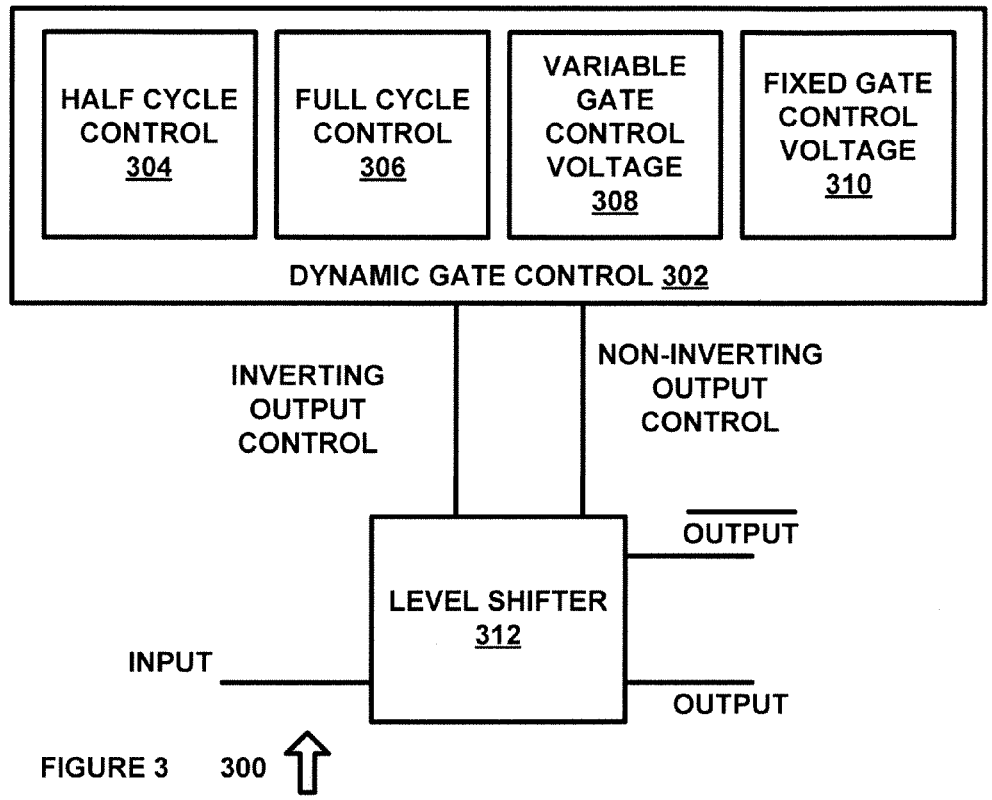
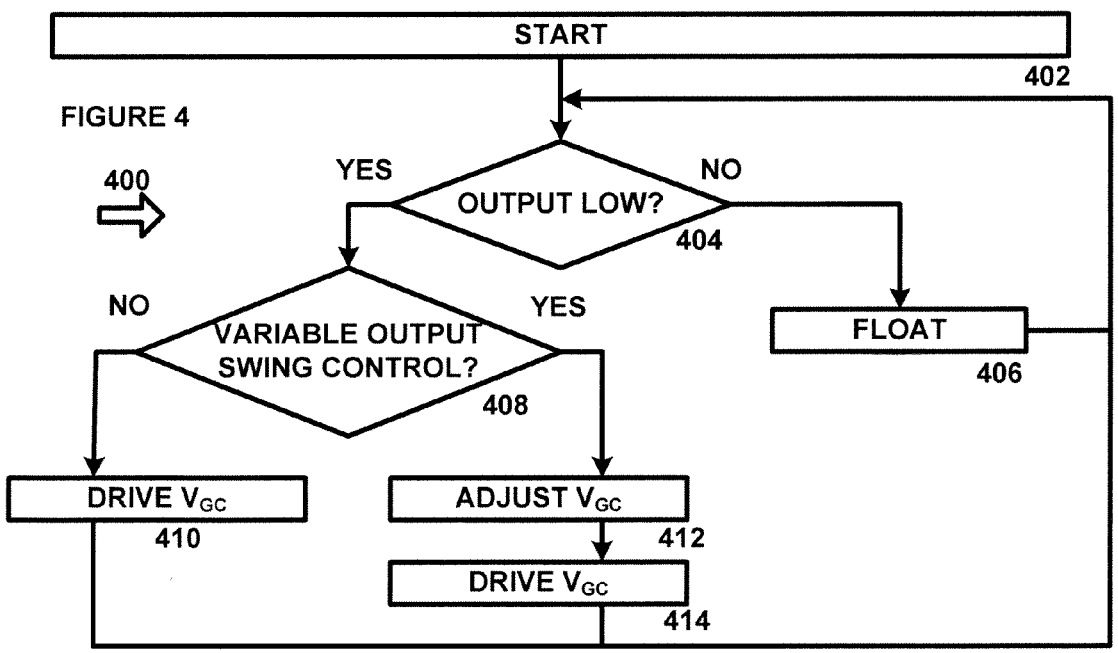

LOW POWER LEVEL SHIFTER WITH OUTPUT SWING CONTROL

CROSS-REFERENCE TO RELATED APPLICATION

The present application is a continuation of U.S. Ser. No. 13/289,926, filed Nov. 4, 2011, now U.S. Pat. No. 8,659,342 which is hereby incorporated by reference for all purposes.

TECHNICAL FIELD

The present disclosure relates generally to level shifters, and more particularly to a low power level shifter with output swing control.

BACKGROUND OF THE INVENTION

Level shifters are used in interfaces between circuitry that sits in different voltage domains. For example, in an integrated circuit, there can be signals between digital circuitry (supplied by 1.0V) and analog circuitry (supplied by 3.3V), as well as input/output systems that typically run at a voltage that is different from the core digital circuitry. Level shifters can be used for these circuit interfaces.

Level shifters are also used within some analog designs, such as power circuitry. In high-voltage applications, such as Class D amplifiers and DC/DC converters, it is often the case that a power stage requires gate drive signals that must be less than the voltage supply, such as due to process limitations. For example, in a 5 V power stage designed in a process that has a 3.3 V oxide, any junction across a single FET must be limited to a voltage level that will not cause the 3.3 V oxide layer to experience a voltage breakdown.

SUMMARY OF THE INVENTION

A low power level shifter is disclosed that includes a first driver transistor for receiving an input signal. A gate-controlled transistor is connected to the first driver transistor, and a second driver transistor is coupled to the gate controlled transistor. An output is coupled to the second driver transistor, and the gate-controlled transistor receives a predetermined gate voltage when the output voltage exceeds a predetermined value, such as when the output voltage is higher or lower than a voltage level at which one of the driver transistors would be exposed to a damaging overvoltage. The voltage applied to the gate of the gate-controlled transistor prevents a damaging overvoltage from being applied to the selected driver transistor.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views, and in which:

FIG. 3 is a diagram of a dynamic gate controlled level shifter system in accordance with an exemplary embodiment of the present disclosure; and FIG. 4 is a diagram of an algorithm for dynamic gate control in accordance with an exemplary embodiment of the present invention.

DETAILED DESCRIPTION OF THE INVENTION

Figure 1:
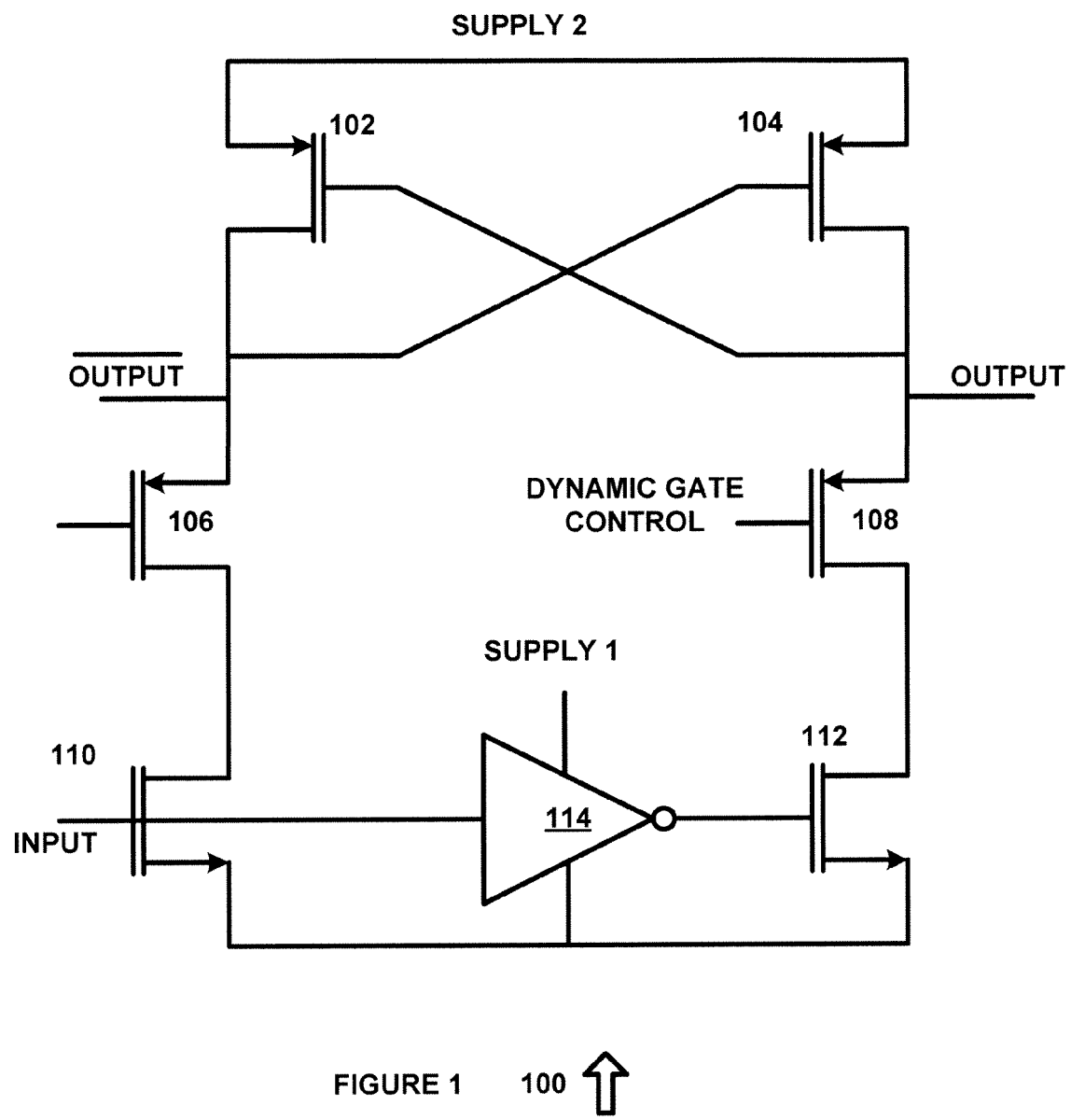
FIG. 1 is a diagram of a system for a low power level shifter with output swing control in accordance with an exemplary embodiment of the present disclosure.

In the description that follows, like parts are marked throughout the specification and drawings with the same reference numerals. The drawing figures might not be to scale and certain components can be shown in generalized or schematic form and identified by commercial designations in the interest of clarity and conciseness.

Level shifters are used in interfaces between circuitry that sits in different voltage domains, such as systems where there are signals transmitted between digital circuitry (supplied by a 1.0V power supply) and analog circuitry (supplied by a 3.3V power supply). Input/output circuitry also typically runs at voltage levels that are different from the core digital circuitry.

Level shifters are also used within some analog designs, such as power circuitry. In high voltage applications, such as Class D amplifiers and DC/DC converters, it is often the case that a power stage requires gate drive signals that must be less than the voltage supply, due to process limitations. For example, in a 5V power stage designed in a process that has a 3.3V oxide, any junction across a single FET must be limited to 3.3V max. The gate voltage of a PFET attached to a 5V supply must equal 5V in the "off" state, and no less than 1.7V in the "on" state.

Furthermore, it is often desired that power FETs in such applications have a programmable on-resistance, which can be achieved by controlling the gate swing voltage of the power FET.

The output voltage of a level shifter can exceed the maximum voltage withstand levels of the output drive transistors in certain applications. For example, speaker drivers in certain audio applications can require a 5V power supply, but the transistor voltage tolerance for the output driver transistor can be limited to 3.3V. If the source of a high-side driver switch is tied to the high voltage supply, the control signal supplied to the gate of high-side driver switch can only be allowed to drop to 3.3V below the high side voltage, or 1.7V, as a voltage lower than that level can damage the output driver transistor. Similarly, the control signal supplied to the gate of a low-side output driver transistor must be limited to 3.3V above the power supply low voltage to prevent damage. For example, if the power supply low voltage is set to ground (0V), the gate voltage cannot go above 3.3V.

In one exemplary disclosed embodiment, a source-follower configured FET is inserted into a level shifter to clamp the output voltage swing to a maximum value, to protect the output driver transistors from overvoltage damage. The gate voltage of the inserted FET can be controlled on a half cycle basis to provide for a controlled output swing in the first half cycle (when the output voltage is low), and to allow the transistor to self-protect in the second half cycle (when the output voltage is high).

In another exemplary embodiment, gate control can be provided for both half cycles, with alternating polarities applied to the output, if gate control for both half cycles is needed. Generally, only a non-inverting output is needed, such that only one of the gates of the level shifter needs to be dynamically controlled, but in another exemplary embodiment, both the inverting and non-inverting outputs can be gate controlled.

When the output of the level shifter is low, the gate can be driven to a predetermined gate control voltage $V_{GC}$, such that the output voltage is clamped to a voltage $V_{GC}+V_T$, where $V_T$ is the threshold voltage of the inserted FET. When $V_{GC}$ is a constant voltage, the output swings to the same voltage on very cycle. Alternatively, $V_{GC}$ can be a controlled voltage if output voltage swing control is required.

When the output is high, application of the gate control voltage can be discontinued and the gate can be terminated in a high-impedance. In this configuration, the gate voltage is pulled up by the gate-to-source capacitance. The gate voltage can alternatively be driven to a voltage higher than $V_{GC}$. The voltage requirement is such that the gate to source voltage of the inserted FET does not exceed the process maximums.

The example above implicitly involved an inserted PFET for the case of an output that swings up to the positive supply and needed a controllable minimum voltage. An NFET can also be inserted instead of the PFET for the case where the output voltage swings down to the low supply (negative or ground), such as an inverting output, and where a controllable maximum voltage is needed.

The disclosed embodiment provides the following features:
1) Low power consumption. No idle current is required.
2) Simpler bias circuit required for output swing control.
3) Allows high speed operation.

FIG. 1 is a diagram of a system 100 for a low power level shifter with output swing control in accordance with an exemplary embodiment of the present disclosure. System 100 can be implemented as an integrated circuit, as discrete devices, or in other suitable configurations.

System 100 includes driver PFETs 102 and 104, driver NFETs 110 and 112, and dynamic gate control PFETs 106 and 108, which are coupled in series between the driver transistors. The non-inverting and inverting outputs are coupled to the drains of driver PFETs 104 and 102, as shown. The signal input is received at the gate of driver NFET 110, and is inverted by inverter 114 and provided to the gate of driver NFET 112. Supply 2 voltage is coupled to the sources of driver PFETs 104 and 102, and supply 1 voltage is coupled to inverter 114.

When the voltage at the non-inverting output is low, dynamic gate control is actuated, such as to provide a fixed or variable level of $V_{GC}$ to dynamic gate control PFET 108. The dynamic gate control maintains the output voltage at $V_{GC}+V_T$, which protects driver PFET 104 from damaging overvoltages. Likewise, a variable value for $V_{GC}$ can be provided, such as where a programmable on resistance is desired.

If protection is also required at the inverting output, the dynamic gate control signal can be provided to dynamic gate control PFET 106 when the voltage at the inverting output is low. A switch can be provided to alternate the gate control voltage between the gates of dynamic gate control PFETs 106 and 108 every half cycle, independent gate control voltages can be provided, or other suitable configurations can be used.

Figure 2:
FIG. 2 is a diagram of a system for a low power level shifter with differential output swing control in accordance with another exemplary embodiment of the present disclosure.

FIG. 2 is a diagram of a system 200 for a low power level shifter with differential output swing control in accordance with an exemplary embodiment of the present disclosure. System 200 can be implemented as an integrated circuit, as discrete devices, or in other suitable configurations.

System 200 includes driver PFETs 102 and 104, driver NFETs 110 and 112, and dynamic gate control NFETs 202 and 204, which are coupled in series between the driver transistors. The non-inverting and inverting outputs are coupled to the drains of driver NFETs 112 and 110, as shown. The signal input is received at the gate of driver NFET 110, and is inverted by inverter 114 and provided to the gate of driver NFET 112. Supply 2 voltage is coupled to the sources of driver NFETs 112 and 110, and supply 1 voltage is coupled to inverter 114.

When the voltage at the non-inverting output is high, dynamic gate control is actuated, such as to provide a fixed or variable level of $V_{GC}$ to dynamic gate control NFET 204. The dynamic gate control maintains the output voltage at $V_{GC}-V_T$, which protects driver NFET 112 from damaging overvoltages. Likewise, a variable value for $V_{GC}$ can be provided, such as where a programmable on resistance is desired.

If protection is also required at the inverting output, the dynamic gate control signal can be provided to dynamic gate control NFET 202 when the voltage at the inverting output is high. A switch can be provided to alternate the gate control voltage between the gates of dynamic gate control NFETs 202 and 204 every half cycle, independent gate control voltages can be provided, or other suitable configurations can be used.

FIG. 3 is a diagram of a dynamic gate controlled level shifter system 300 in accordance with an exemplary embodiment of the present disclosure. System 300 includes level shifter 312 and dynamic gate control 302. Dynamic gate control 302 generates dynamic gate control signals for use in controlling the gate voltage of level shifter 312.

Dynamic gate control 302 can be implemented in hardware or a suitable combination of hardware and software, and can be one or more software systems operating on a suitable processor platform. As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications or on two or more processors, or other suitable software structures. In one exemplary embodiment, software can include one or more lines of code or other suitable software structures operating in a general purpose software application, such as an operating system, and one or more lines of code or other suitable software structures operating in a specific purpose software application.

Dynamic gate control 302 includes half cycle control 304, full cycle control 306, variable gate control voltage 308 and fixed gate control voltage 310. Half cycle control 304 generates a gate control voltage for application during a half cycle, such as when a voltage is controlled at a non-inverting output only or at an inverting output only. The gate control voltage can be generated using variable gate control voltage 308, fixed gate control voltage 310 or in other suitable manners.

Full cycle control 306 generates a gate control voltage for application during both halves of a full cycle, such as when a voltage is controlled at both an inverting output and a non-inverting output. The gate control voltage can be generated using variable gate control voltage 308, fixed gate control voltage 310 or in other suitable manners. In one exemplary embodiment, full cycle control 306 can alternate the application of the gate control voltage when it detects that the output voltage transitions from low to high. In another exemplary embodiment, full cycle control 306 can alternate the application of the gate control voltage every half cycle. Other suitable configurations can also or alternatively be used.

Variable gate control voltage 308 allows the gate control voltage to be varied, such as to provide a programmable on resistance. In one exemplary embodiment, the value of the programmable on resistance can be stored in a first register and the gate control voltage can be dynamically calculated as a function of the stored on resistance value and other circuit parameters.

Fixed gate control voltage 310 provides a fixed gate control voltage to one or more transistors. In one exemplary embodiment, fixed gate control voltage 310 can provide a predetermined gate control voltage level to a transistor during a half cycle. In another exemplary embodiment, fixed gate control voltage 310 can provide a first predetermined gate control voltage level to a first transistor during a first half cycle, and a second predetermined gate control voltage level to a second transistor during a second half cycle. Other suitable voltages can also or alternatively be supplied.

Level shifter 312 receives an input and generates a non-inverting output and/or an inverting output. Level shifter 312 receives a non-inverting output control and/or an inverting output control from dynamic gate control 302, which are used to limit the maximum voltage that output driver transistors are exposed to, to control a programmable on resistance, and to provide other suitable functionality.

FIG. 4 is a diagram of an algorithm 400 for dynamic gate control in accordance with an exemplary embodiment of the present invention. Algorithm 400 can be used to protect a PFET driver transistor from damaging overvoltages when the output voltage is low, as discussed above. Algorithm 400 can be implemented in hardware or a suitable combination of hardware and software, and can be one or more software systems operating on a suitable processor platform.

Algorithm 400 begins at 402, where processing is initiated. In one exemplary embodiment, processing can be initiated when an amplifier controller is actuated or in other suitable manners. The algorithm then proceeds to 404.

At 404, it is determined whether an output low condition exists. If an output low condition does not exist, the algorithm proceeds to 406 where the gate control voltage is not applied, a high impedance is applied to the gate of a gate-controlled transistor, or other suitable conditions are implemented for one half cycles or until the output voltage transitions from positive to negative. If it is determined that an output low condition exists at 404, the algorithm proceeds to 408.

At 408, it is determined whether variable output swing control is to be applied. If variable output swing control is not to be applied, the algorithm proceeds to 410 where a constant $V_{GC}$ value is applied to the gate-controlled transistor for one half cycle or until the voltage transitions from negative to positive. In one exemplary embodiment, the value of the $V_{GC}$ voltage can be selected to limit the maximum voltage imposed on a driver output transistor. The algorithm then returns to 404.

If it is determined at 408 that variable output swing control is to be applied, the algorithm proceeds to 412 where the value of $V_{GC}$ is adjusted, such as based on a value of a programmable on resistance stored in a register or in other suitable manners. The algorithm then proceeds to 414 where $V_{GC}$ is applied for one half cycles or until the output voltage transitions from negative to positive. The algorithm then returns to 404.

Algorithm 400 can be used in a level shifter with both inverting and non-inverting outputs. In this exemplary embodiment, algorithm 400 can be implemented for each gate controlled transistor, an output transition can be used to alternate application of $V_{GC}$ to alternating gate-controlled transistors, or other suitable functions can be utilized.

In operation, algorithm 400 allows a low power level shifter with output control to be operated in a manner that limits the maximum voltage applied to an output driver transistor when the output voltage is low. Likewise, algorithm 400 can also be used to protect a driver transistor when the output voltage is high, such as an NFET driver transistor as discussed above, by detecting whether an output high condition exists or in other suitable manners.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A level shifter comprising:
an input signal receiver comprising a driver transistor;
a gate-controlled transistor coupled to the input signal receiver;
an output coupled to the gate controlled transistor; and
a half cycle control coupled to the level shifter, wherein the half cycle control is configured to generate a gate voltage to be applied to the gate-controlled transistor for a duration of one half cycle of a predetermined cycle;
wherein the gate-controlled transistor is configured to receive a predetermined gate control voltage when the output voltage exceeds a predetermined value.

2. The level shifter of claim 1 wherein the input signal receiver is an NFET driver transistor.

3. The level shifter of claim 1 further comprising a PFET driver transistor coupled with the output and gate-controlled transistor.

4. The level shifter of claim 1 further comprising a dynamic gate controller coupled to the level shifter, wherein the dynamic gate controller is configured to generate the gate voltage to be applied to the gate-controlled transistor.

5. The level shifter of claim 1 further comprising a full cycle control coupled to the level shifter, wherein the full cycle control is configured to generate the gate voltage to be applied to the gate-controlled transistor for a duration of one full cycle.

6. The level shifter of claim 1 further comprising a fixed gate control voltage coupled to the level shifter, wherein the fixed gate control voltage is configured to generate a fixed gate control voltage to be applied to the level shifter.

7. The level shifter of claim 1 further comprising a variable gate control voltage coupled to the level shifter, wherein the variable gate control voltage is configured to generate a variable gate voltage to be applied to the gate-controlled transistor.

8. The level shifter of claim 1 wherein the input signal receiver is an NFET driver transistor, the gate controlled transistor is a PFET, and further comprising a dynamic gate controller coupled to the level shifter, wherein the dynamic gate controller is configured to generate the gate voltage to be applied to the gate-controlled transistor.

9. The level shifter of claim 1 wherein the input signal receiver is an NFET driver transistor, the gate controlled transistor is an NFET, and further comprising a dynamic gate controller coupled to the level shifter, wherein the dynamic gate controller is configured to generate the gate voltage to be applied to the gate-controlled transistor.

10. The level shifter of claim 1 further comprising: a full cycle control coupled to the level shifter, wherein the full cycle control is configured to generate the gate voltage to be applied to the gate-controlled transistor for a duration of one full cycle; and
a variable gate control voltage coupled to the level shifter, wherein the variable gate control voltage is configured to generate a variable gate voltage to be applied to the gate-controlled transistor.

11. A level shifter comprising:
an NFET driver transistor for receiving an input signal;
a gate-controlled transistor coupled to the NFET driver transistor;
a PFET driver transistor coupled to the gate controlled transistor;
a half cycle control coupled to the level shifter, wherein the half cycle control is configured to generate a gate voltage to be applied to the gate-controlled transistor for a duration of one half cycle of a predetermined cycle; and
an output coupled to the PFET driver transistor;
wherein the gate-controlled transistor is configured to receive a predetermined gate control voltage when the output voltage exceeds a predetermined value.

12. The level shifter of claim 11 wherein the gate-controlled transistor is an NFET or a PFET.

13. The level shifter of claim 11 further comprising a full cycle control coupled to the level shifter, wherein the full cycle control is configured to generate the gate voltage to be applied to the gate-controlled transistor for a duration of one full cycle.

14. The level shifter of claim 11 further comprising a dynamic gate controller coupled to the level shifter, wherein the dynamic gate controller is configured to generate the gate voltage to be applied to the gate-controlled transistor.

15. The level shifter of claim 11 further comprising a variable gate control voltage coupled to the level shifter, wherein the variable gate control voltage is configured to generate a variable gate voltage to be applied to the gate-controlled transistor.

16. The level shifter of claim 11 further comprising: a dynamic gate controller coupled to the level shifter, wherein the dynamic gate controller is configured to generate the gate voltage to be applied to the gate-controlled transistor; and
a variable gate control voltage coupled to the level shifter, wherein the variable gate control voltage is configured to generate a variable gate voltage to be applied to the gate-controlled transistor.

17. The level shifter of claim 11 further comprising:
a full cycle control coupled to the level shifter, wherein the full cycle control is configured to generate the gate voltage to be applied to the gate-controlled transistor for a duration of one full cycle; and
a variable gate control voltage coupled to the level shifter, wherein the variable gate control voltage is configured to generate a variable gate voltage to be applied to the gate-controlled transistor.

18. A level shifter comprising:
a pair of driver transistors for receiving an input signal and generating an output signal;
a variable gate control voltage coupled to the level shifter, wherein the variable gate control voltage is configured to generate a variable gate control voltage to be applied to the level shifter; and
a cycle control coupled to the level shifter, wherein the cycle control is configured to generate the gate control voltage for a duration of a predetermined cycle.

19. The level shifter of claim 18 further comprising: a second pair of driver transistors configured to receive the input signal and to generate the output signal.

20. The level shifter of claim 18 further comprising a fixed gate control voltage coupled to the level shifter, wherein the fixed gate control voltage is configured to generate a fixed gate control voltage to be applied to the level shifter.

* * * * *